United States Patent [19]
Chen et al.

[11] Patent Number: 6,165,803
[45] Date of Patent: *Dec. 26, 2000

[54] MAGNETIC RANDOM ACCESS MEMORY AND FABRICATING METHOD THEREOF

[75] Inventors: Eugene Y. Chen, Gilbert; Jon M. Slaughter, Tempe, both of Ariz.

[73] Assignee: Motorola, Inc., Schaumburg, Ill.

[ * ] Notice: This patent is subject to a terminal disclaimer.

[21] Appl. No.: 09/312,833

[22] Filed: May 17, 1999

[51] Int. Cl.[7] .................................................. H01L 21/00
[52] U.S. Cl. ..................................... 438/3; 438/3
[58] Field of Search ................... 438/3, 48, 238, 438/595; 365/171

[56] References Cited

U.S. PATENT DOCUMENTS

| | | |
|---|---|---|
| 5,804,458 | 9/1998 | Tehrani et al. ............................ 438/3 |
| 5,940,319 | 8/1999 | Durlam et al. ......................... 365/171 |
| 6,048,739 | 4/2000 | Hurst et al. .............................. 438/3 |

Primary Examiner—David Nelms
Assistant Examiner—David Nhu
Attorney, Agent, or Firm—William E. Koch

[57] ABSTRACT

An improved and novel fabrication method for a magnetic element, and more particularly its use in a magnetoresistive random access memory (MRAM) is provided. An MRAM device has memory elements and circuitry for managing the memory elements. The circuitry includes transistor (12a), digit line (29), etc., which are integrated on a substrate (11). The circuitry is fabricated first under the CMOS process and then magnetic memory elements (43, 44) are defined by transforming portions (42b) of a magnetic blanket layer into an insulative material. The magnetic blanket layer, which includes magnetic layers (40,42) and a non-magnetic layer (41) sandwiched by the magnetic layers, which are deposited on conductor layer (34). The insulative, or inactive, portions (42b) define and separate the plurality of memory elements (43, 44).

18 Claims, 4 Drawing Sheets

MAGNETIC RANDOM ACCESS MEMORY AND FABRICATING METHOD THEREOF

FIELD OF THE INVENTION

The present invention relates to magnetic elements for information storage and/or sensing and a fabricating method thereof, and more particularly, to a method of fabricating and thus defining the magnetic element of a magnetic random access memory (MRAM) element.

BACKGROUND OF THE INVENTION

This application is related to a co-pending application that bears Motorola docket number CR97-133 and U.S. Ser. No. 09/144,686, entitled "MAGNETIC RANDOM ACCESS MEMORY AND FABRICATING METHOD THEREOF," filed on Aug. 31, 1998, incorporated herein by this reference and co-pending application that bears Motorola docket number CR 97-158 and U.S. Ser. No. 08/986,764, entitled "PROCESS OF PATTERNING MAGNETIC FILMS" filed on Dec. 8, 1997, incorporated herein by reference.

A magnetic memory element has a structure that includes ferromagnetic layers separated by a non-magnetic layer. Information is stored as directions of magnetization vectors in magnetic layers. Magnetic vectors in one magnetic layer, for instance, are magnetically fixed or pinned, while the magnetization direction of the other magnetic layer is free to switch between the same and opposite directions that are called "Parallel" and "Antiparallel" states, respectively. In response to Parallel and Antiparallel states, the magnetic memory element represents two different resistances. The resistance has minimum and maximum values when the magnetization vectors of the two magnetic layers point in substantially the same and opposite directions, respectively. Accordingly, a detection of changes in resistance allows an MRAM device to provide information stored in the magnetic memory element.

An MRAM device integrates magnetic memory elements and other circuits, for example, a control circuit for magnetic memory elements, comparators for detecting states in a magnetic memory element, input/output circuits, etc. These circuits are fabricated in the process of CMOS (complementary metal-oxide semiconductor) technology in order to lower the power consumption of the MRAM device. The CMOS process requires high temperature steps that exceed 300° C. for depositing dielectric and metal layers and annealing implants, for example.

Magnetic layers employ ferromagnetic material such as alloys of nickel (Ni), iron (Fe) and/or cobalt (Co) that require processing below 300° C. in order to prevent intermixing of magnetic materials caused by high temperatures. Accordingly, magnetic memory elements need to be fabricated at a different stage after CMOS processing.

Magnetic memory elements contain components that are easily oxidized and also sensitive to corrosion. To protect magnetic memory elements from degradation and keep the performance and reliability of the MRAM device, a passivation layer is formed over magnetic memory elements.

In addition, a magnetic memory element includes very thin layers, some of them are tens of angstroms thick. The performance of the magnetic memory element is sensitive to the surface conditions on which magnetic layers are deposited. Accordingly, it is necessary to make a flat surface to prevent the characteristics of an MRAM device from degrading.

Metal lines are employed to produce magnetic fields for writing and/or reading states in a magnetic memory element. Less amount of current is desired to minimize power consumption.

During typical MRAM element fabrication, the top electrode includes a layer of ferromagnetic material such as alloys of Ni, Fe, and/or Co. This layer, although relatively thin, is difficult to etch. Typically, the top electrode is defined using standard ion milling or dry etch, such as reactive ion etch (RIE), techniques which result in over-etch and under-etch problems, in that there is a lack of a proper etch stop. Wet etching will etch isotropically and thus etches the electrode laterally. In addition, a problem exists with uncontrolled side oxidation of the layers from the exposure of the sides and top of the electrode subsequent to etching. This natural oxidation, or thermal degradation, of the sides of the electrode when exposed to air, is dependent upon how long the wafer sits exposed to the air, and the humidity and temperature of the air. These over-etch and under-etch problems, as well as the uncontrolled oxidation of the layers, leads to shorting within the device, variations in the switching field, and degradation of memory cell performance.

Accordingly, it is a purpose of the present invention to provide an improved MRAM device that prevents a magnetic memory element from thermal degradation and etch problems while fabricating the device.

It is another purpose of the present invention to provide an improved MRAM device that includes defined magnetic memory elements.

It is a still further purpose of the present invention to provide a method of forming MRAM device top electrodes by defining insulating and non-magnetic areas around the desired active areas, thereby forming individual MRAM device elements without device degradation.

It is still a further purpose of the present invention to provide a method of forming an MRAM element which is amenable to high throughput manufacturing.

SUMMARY OF THE INVENTION

These needs and others are substantially met through provision of a magnetoresistive random access memory (MRAM) that includes magnetic memory elements on circuitry for controlling operations of magnetic memory elements. First, the circuitry is formed on a substrate under the CMOS process that requires a heat treatment of 300° C. or more. While fabricating the circuitry, conductive lines are also formed, which are used to create magnetic fields for writing and/or reading states in the magnetic memory element. The metal lines are enclosed by high permeability material such as a permalloy layer that facilitates magnetic fields to concentrate on the magnetic memory element. After completion of the circuitry, a surface of the layer including the circuitry is polished by the chemical mechanical polishing (CMP) process that produces a flat surface on the layer including the circuitry, then a dielectric layer is deposited on the surface with filled via openings for the magnetic memory to make contact to the CMOS circuitry.

Next, a bottom contact metal layer is deposited and etched, followed with magnetic memory and top conductive metal layer deposition. Alternatively, a blanket layer, which forms a bottom conductive metal, magnetic memory, and top conductive metal, is deposited over the dielectric layer. Next, using standard dry etch techniques such as RIE and/or ion milling, the whole blanket layer is etched into the shape of the bottom contact metal which is equal or larger than the shape of the top contact metal. The electrically conductive layer, which will define the contact metal pads, is etched using standard RIE techniques, and thereby serves as a mask for transforming, typically through oxidation or nitridation, of portions of the top electrode, or uppermost blanket layer into an insulating material. This oxidation or nitridation of the uppermost blanket layer provides for masked area to remain metallic and magnetic and thus active, and provides for the portion subject to the oxidation or nitridation to become inactive, serving as an insulator and thus defining a magnetic memory element and including an uppermost flat surface. In an alternative embodiment, oxidation or nitridation of the exposed portion is performed so as to transform the selected areas of the blanket layer, including all layers that make up the blanket layer, into an insulative material. After forming the magnetic memory element an electrically conductive line is formed on the flat surface, which is coupled to the magnetic memory element through the metal contact pads. Fabrication of the magnetic memory element to include oxidized/nitridized portions defining the individual memory elements improves the switching field performance due to better size control and reliability of the individual magnetic memory elements due to the resulting insulator protecting the edges of the memory elements, and avoids shorting problems across the tunnel barrier in the magnetic memory element and thermal degradation of the magnetic memory elements during the fabrication process.

DETAILED DESCRIPTION OF THE PREFERRED EMBODIMENTS

FIGS. 1–13 illustrate cross-sectional views of sequential steps for fabrication of an MRAM device which includes transistors for switching magnetic memory elements in reading operations.

Figure 1:
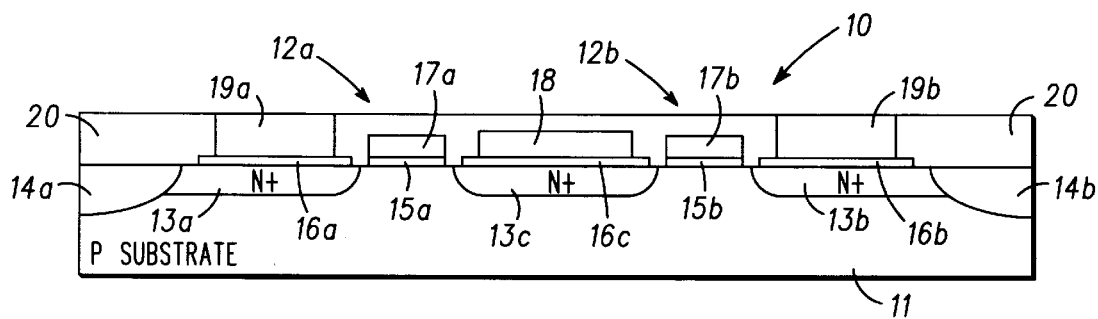
FIGS. 1–13 show cross-sectional views of sequential steps in the formation of an MRAM device according to the present invention.

Referring specifically to FIG. 1, a cross-sectional view of a partially fabricated magnetic device 10, more particularly a magnetoresistive random access memory (MRAM) device, is illustrated, wherein device 10 includes a P-type silicon substrate 11. Device 10 has circuitry, for instance, NMOS switching transistors 12a and 12b which are fabricated by the well known CMOS process. Other circuit elements, for example, input/output circuit, data/address decoder, and comparators, may be contained in the MRAM device, however they are omitted from the drawings for simplicity.

First of all, substrate 11 is provided to pattern windows for N+ regions 13a, 13b and 13c and implant the source/drain regions 13a, 13b and 13c. Then isolation regions 14a and 14b are formed for separation. Next, poly-Si layers 15a and 15b are deposited on substrate 11 for forming gate regions. Metal layers 16a and 16b are deposited on N+ region 13a and 13b for source electrodes while metal layer 16c is deposited on N+ region 13c for a drain electrode. Further, metal layers 17a and 17b for gate electrodes are deposited on poly-Si layers 15a and 15b, respectively. A conductor line 18 is formed on metal layer 16c, which provides a sense current to magnetic memory elements through transistors 12a and 12b. A magnetic memory element will be explained hereinafter. Plug conductors 19a and 19b, which work for conducting a sense current to magnetic memory elements, are formed on and interconnected to metal layers 16a and 16b, respectively. All circuit elements of an MRAM device, except magnetic memory elements, digit lines and word lines, are integrated on substrate 11 before dielectric material 20 is filled. Then, the surface of device 10 is polished flat utilizing CMP (Chemical Mechanical Polishing) techniques.

Figure 2:
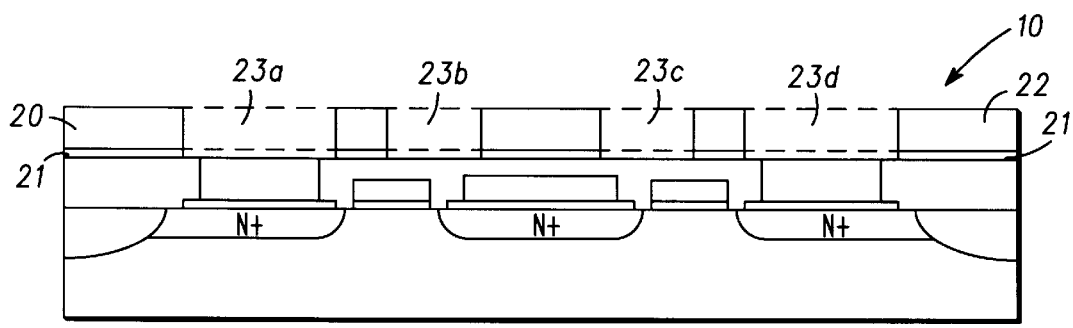

After partially fabricated MRAM device 10 has been completed, magnetic memory elements are formed on device 10 along with digit lines and word lines. As shown in FIG. 2, an etch stop layer 21, which employs material such as AlN, AlO and SiN, is deposited on the surface of device 10. Instead of etch stop layer 21, other techniques such as endpoint etches may be used. A silicon dioxide layer 22 is deposited with a thickness of 4,000–6,000 Å on etch stop layer 21.

In the next step, a mask layer is deposited on silicon dioxide layer 22 and is patterned and defined as an etching mask using a standard lithography technique. As shown in FIG. 2, silicon dioxide 20 is etched away to etch stop layer 21 that makes trenches 23a–23d in silicon dioxide layer 22, and then the exposed etch stop layer is removed from trenches 23a–23d.

Figure 3:
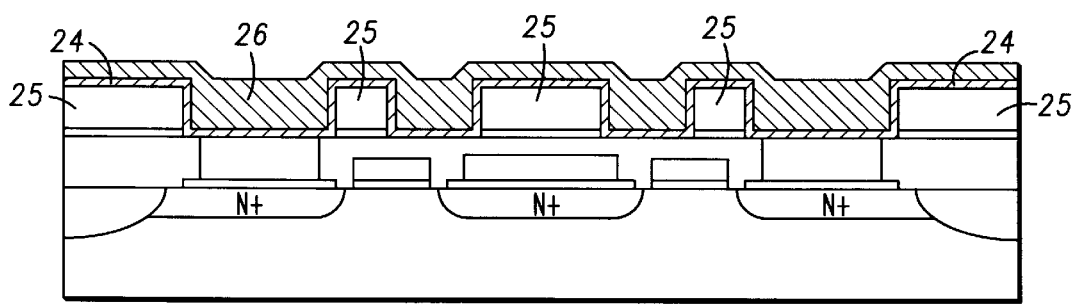
Figure 4:
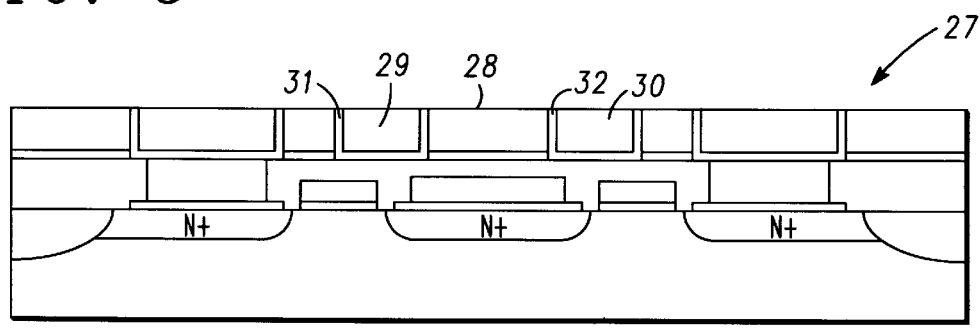

Referring to FIG. 3, a thin field focusing layer 24 having a high permeability such as nickel-iron is deposited overlying trenches 23a–23d and a silicon dioxide dielectric layer 25. High permeability layer 24 is 5–500 Å thick. In order to improve adhesion of field focusing layer 24 and to provide a barrier for Ni or Fe diffusion into dielectric layer of Ta or TaN or other such materials could be added between field focusing layer 24 and dielectric layer 25. A conductor metal layer 26 is then deposited on field focusing layer 24. As a conductor metal, aluminum, aluminum alloys, copper, and copper alloys are employed. In order to improve adhesion of field focusing layer 24 and to provide a barrier for Ni or Fe diffusion into the conductor and/or dielectric a layer of Ta or TaN or such materials could be added between field focusing layer 24 and conductor layer 26. After depositing metal layer 26, the metal bulged out of trenches 23a–23d and the high permeability layer 24 on silicon dioxide layer 25 is removed from a top surface by the CMP process so that, as shown in FIG. 4, a partially fabricated MRAM device 27 having a flat top surface 28 is produced.

Partially fabricated MRAM device 27 includes torque or digit lines 29 and 30 on which magnetic memory elements are formed. Digit lines 29 and 30 carry a current to generate a magnetic field which causes magnetic memory elements to store states. Digit lines 29 and 30 are enclosed by high permeability layers 31 and 32 excluding a portion on the top surface 28. Layer 31, for example, shields the magnetic field generated by current flowing in digit line 29 from magnetic flux leakage, and facilitates the magnetic field to focus on a magnetic memory element placed on digit line 29 through top surface 28 not covered by layer 31. In addition, layer 31 shields stray magnetic fields due to neighboring magnetic elements or external sources away from the magnetic element placed on digit line 29, thus making it possible to build a densely packed memory immune to external magnetic fields to a degree.

Figure 5:
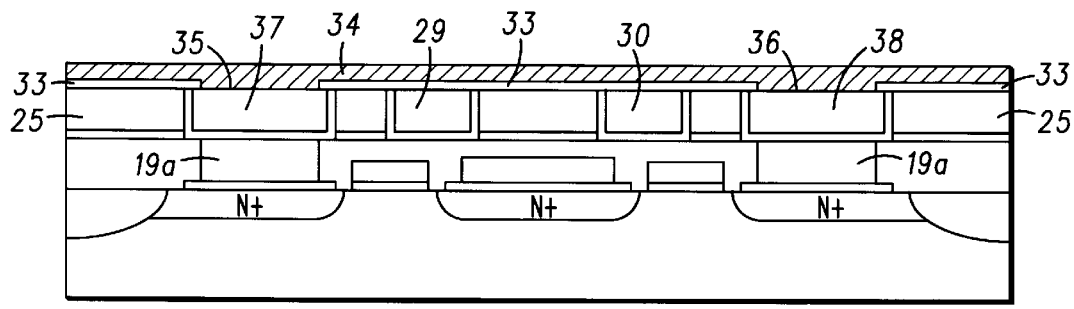

Referring to FIG. 5, a dielectric layer 33 is deposited over digit lines 29 and 30 and dielectric layer 25, and a conductor layer 34 is deposited over dielectric layer 33. Dielectric layer 33 is placed between digit lines 29 and 30 and conductor layer 34 to provide electrical isolation therebetween. Dielectric layer 33 is partially etched to make windows 35 and 36 on metal conductors 37 and 38 which are employed to electrically connect plug conductors 19a and 19b to conductor layer 34. After making windows 35 and 36, conductor layer 34 is deposited with a thickness of around 500 Å over dielectric layer 33 and metal conductors 37 and 38. In order to form magnetic memory elements on conductor layer 34, a top surface of conductor layer 34 needs to be smooth and flat because magnetic memory elements have very thin films, thereby a good condition for a magnetic memory element is attained. Surface 39 is polished and formed by a planarizing process such as CMP.

Figure 6:
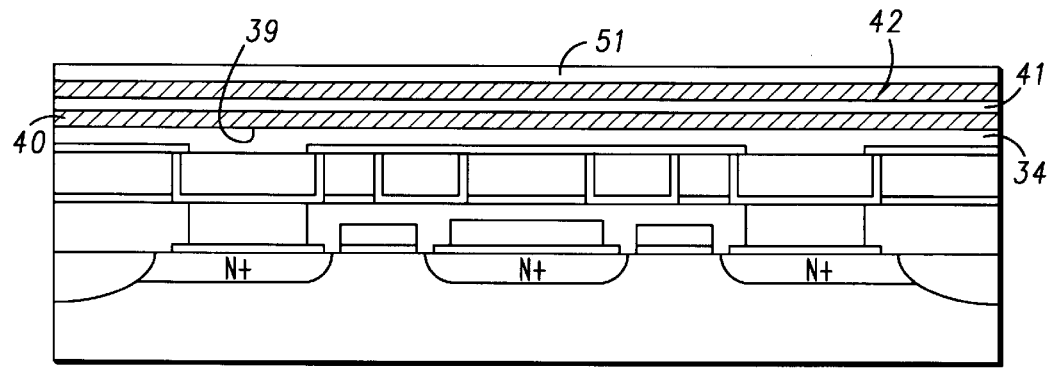

Next, as shown in FIG. 6, a plurality of magnetic element blanket layers, or magnetic memory blanket layers, 40–42 for magnetic memory elements are deposited by either physical vapor deposition (PVD) or ion beam deposition (IBD) techniques on surface 39 of conductor layer 34. Bottom and top magnetic layers 40 and 42 utilize magnetic material such as alloys of Ni, Fe, and/or Co while layer 41 employs a non-magnetic material such as $Al_2O_3$ or Cu. Bottom layer 40, for example, serves as a hard magnetic layer, magnetization in which is pinned or fixed, whereas magnetization directions in top magnetic layer 42 are free. Non-magnetic layer 41 is formed by the following methods. An aluminum film is deposited over bottom magnetic layer 40, then the aluminum film is oxidized by an oxidation source, such as an RF-produced oxygen plasma. In an alternative method, aluminum is deposited together with oxide on layer 40, and then oxidation is carried out in oxygen ambient either heated or unheated. The layers in the magnetic memory element are very thin with magnetic layers varying from 3 to 200 Å and non-magnetic layer 41 from 3 to 100 Å.

Next, as illustrated in FIG. 6, a masking layer 51, more particularly a layer of conductive material, is deposited over layer 42. A mask pattern is formed on conductive layer 51 and etched down to dielectric layer 33 to define conductor lines 45 and 46 on dielectric layer 33. Conductor lines 45 and 46 electrically couple magnetic memory element 43 and transistor 12a through plug conductor 19a, and magnetic memory element 44 and transistors 12b through plug conductor 19b, respectively. Conductor lines 45 and 46 are isolated from digit lines 29 and 30 by dielectric layer 33, respectively.

Figure 7:
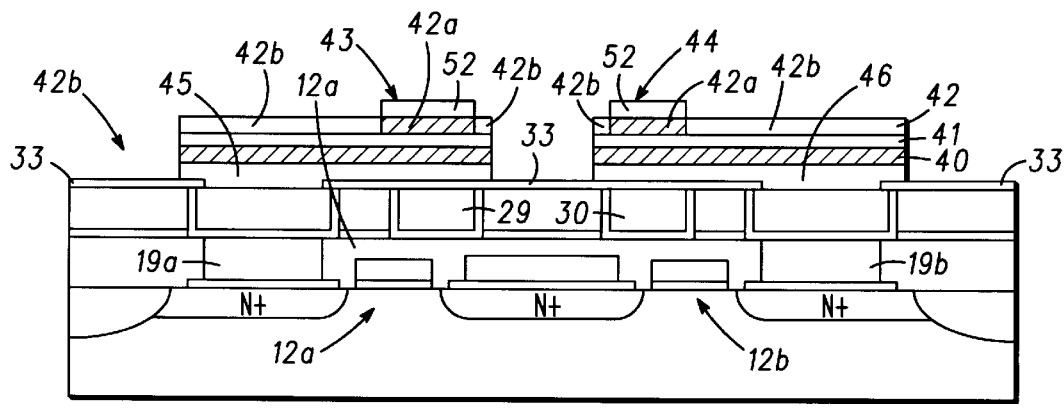

Next, a new mask pattern is formed on layer 51. Masking layer, or conductive material layer, 51 and blanket layers 40–42 are etched using reactive ion etching (RIE) techniques to electrically define the plurality of magnetic elements and form a plurality of contact metal pads, or conductive lines, 52 as illustrated in FIG. 7. Subsequent to the formation of the plurality of contact metal pads 52, portions of layer 42 are changed into a material containing dielectric properties utilizing either oxidation or nitridation techniques. More specifically, selected areas of the uppermost layer 42 of magnetic material are transformed into an insulating material, and form dielectric insulators. During the processing of transforming layer 42 into an insulating material, contact metal pads 52 act as a mask so that after the oxidation, or nitridation, takes place, a plurality of active areas 42a are defined, which remain metallic, and a plurality of inactive areas, or dielectric insulators, 42b are defined where the now insulative portions are located. Oxidation techniques which may be utilized include plasma oxidation, annealing in an atmosphere containing oxygen, and thermal oxidation at room temperatures, such as a temperature within a range of 0–50° C., or at a higher temperature, such as a temperature in excess of 50° C. Nitridation techniques which may be utilized include plasma nitridation and thermal nitridation at room temperatures, such as a temperature within a range of 0–50° C., or at a higher temperature, such as a temperature in excess of 50° C., more particularly at a temperature in excess of 100° C.

In an alternative embodiment, oxidation or nitridation techniques are utilized to transform exposed portions of blanket layers 40, 41 and 42, thus transforming these portions into an insulative material and thus making them inactive.

Figure 8:
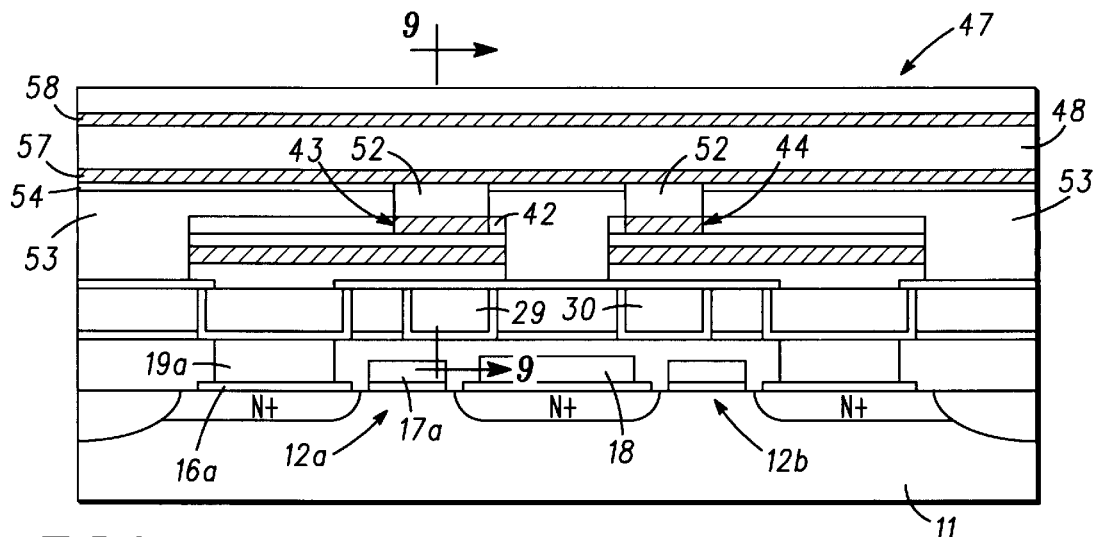
Figure 9:
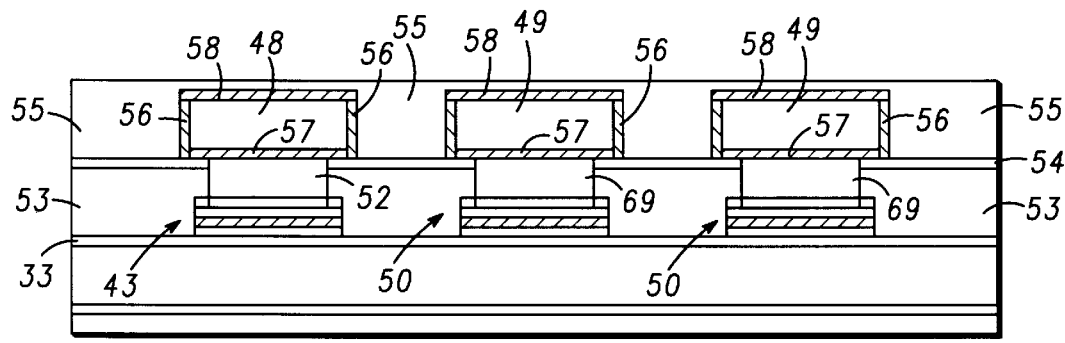

Referring to FIGS. 8 and 9, an enlarged cross-sectional view of an MRAM device 47 and a partial cross-sectional view through digit line 29, magnetic memory element 43, and a bit line 48 indicated by arrows 9—9 in FIG. 8 are illustrated. It should be noted that although three bit lines 48 and 49 and three magnetic memory elements 43 and 50 are shown in FIG. 9 for simplicity, more bit lines and magnetic memory elements are formed for MRAM device 47.

Referring to FIG. 8 again, after the oxidizing or nitridizing of layer 42 has been completed in order to form magnetic memory elements, or cells, 43 and 44 as shown in FIG. 7, dielectric layer 53 is deposited overlying magnetic memory elements 43 and 44, and the inactive portions 42b of blanket layer 42. Next, an etch stop layer 54 is deposited on dielectric layer 53 and, further, a dielectric layer 55 in FIG. 9 is deposited on etch stop layer 54. Next, a mask is patterned on dielectric layer 55 to form trenches for bit lines 48 and 49.

According to the mask, as shown in FIG. 9, dielectric layer 55 is etched down to etch stop layer 54 to make the trenches for bit lines 48 and 49. Next, a permalloy layer 56 is deposited over dielectric layer 55 and in the trenches. The permalloy layer is etched by an anisotropic etching which leaves only a permalloy layer 56 on the sidewalls of the trenches and removes the permalloy layer on dielectric layer 55 and the bottom of the trenches. After forming permalloy layer 56, a layer 57, which is electrically conductive, is deposited on the surface of conductive lines 52 and 69, and a metal such as Al, W, and Cu is filled in the trench for forming bit lines 48 and 49. Next, unnecessary material on dielectric layer 55 is removed and the surface of dielectric layer 55 and bit lines 48 and 49 is polished to a flat surface. Finally, a permalloy layer 58 is deposited and patterned on dielectric layer 55 and bit lines 48 and 49. Permalloy layers 56 and 58 enclose bit line 48, by which a magnetic field generated by a bit current in bit line 48 is concentrated toward magnetic memory element 43 and shielded to protect information in other magnetic memory elements.

Referring to FIG. 8 again, reading and writing operations of the MRAM device are briefly discussed hereinafter. Assume that magnetic memory element 43 is selected, for example. In a reading operation, a turn-on signal is applied to gate electrode 17a to turn on transistor 12a which allows a sense current to flow from drain electrode 18 through metal layer 16a, plug conductor 19a, conductor line 45 and magnetic memory element 43, to bit line 48. The sense current produces a voltage drop over magnetic memory element 43 which determines states stored in magnetic memory element 43. That is, the voltage drop is provided to voltage comparators (not shown) which compare with reference voltages to give states stored in magnetic memory element 43.

In order to write states in magnetic memory element 43, for example, bit and digit currents, which are provided to bit line 48 and digit line 29, generate magnetic fields, respectively. The magnetic field generated by the digit current is superimposed on the magnetic field generated by the bit current so that the total magnetic field is applied to write states in magnetic memory element 43. Directions of combined magnetic fields determine magnetization directions in free magnetic layer 42, thereby magnetic memory element 43 memorizes states or information. Digit line 29 is enclosed by permalloy layer 31 while bit line 48 is enclosed by permalloy layer 56 and 58. Permalloy layers 31, 56 and 58 facilitate magnetic fields generated by digit and bit currents to focus on magnetic memory element 43. Accordingly, less current is required to write and sense states in the magnetic memory elements.

Figure 10:
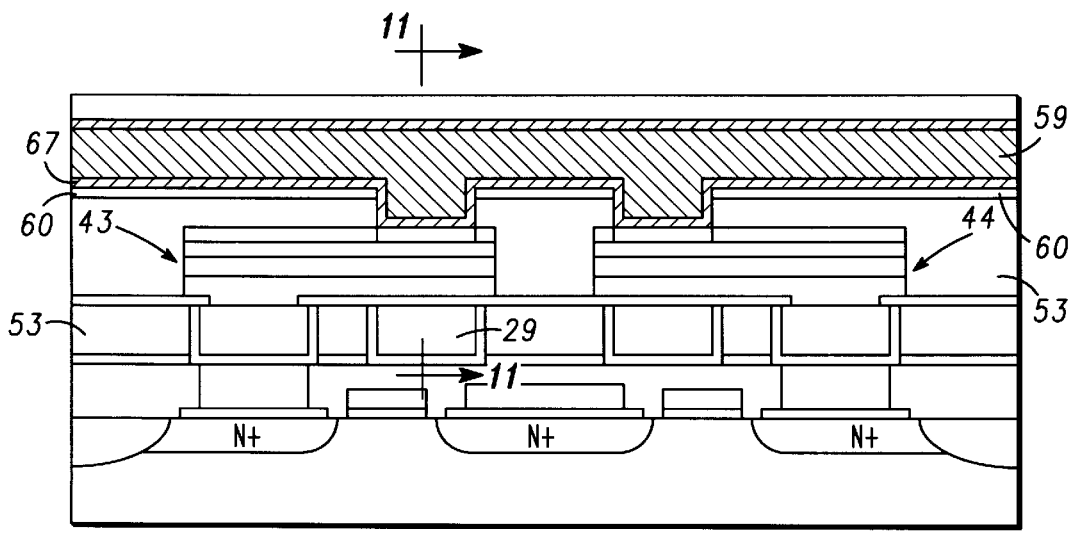
Figure 11:
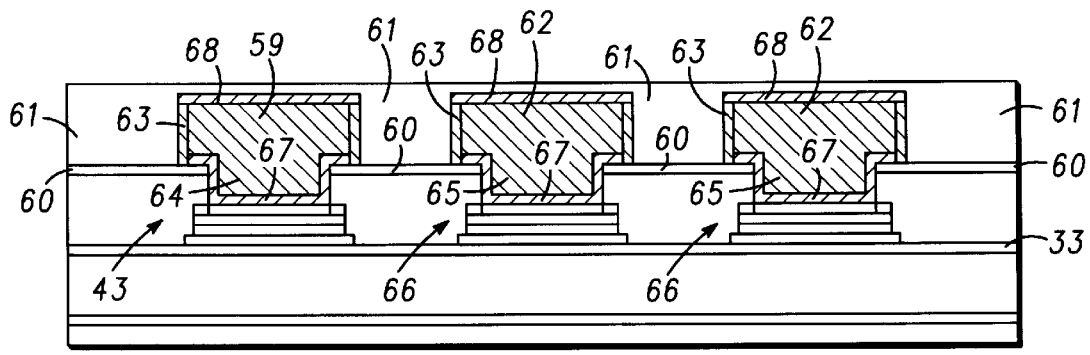

Another embodiment for forming a bit line is illustrated in FIGS. 10 and 11. FIG. 11 is a partial cross-sectional view through digit line 29, magnetic memory element 43, and a bit line 59 indicated by arrows 11—11 in FIG. 10. After the formation shown in FIG. 7 has been completed, as shown in FIG. 10, a dielectric layer 53 is deposited overlying magnetic memory elements 43 and 44 and the top surface of the dielectric layer 53 is polished. Then an etch stop layer 60 and a dielectric layer 61 on the surface of etch stop layer 60 are deposited sequentially. A mask is deposited and patterned on the dielectric layer 61 to form trenches for bit lines 59 and 62 in FIG. 11.

Next, referring to FIG. 11, dielectric layer 61 is etched until etch stop layer 60 according to the mask so that trenches are formed for bit lines 59 and 62. Then, a permalloy layer is deposited on dielectric layer 61 and in the trenches. The permalloy layer is patterned and etched by an anisotropic etching which leaves only a permalloy layer 63 on the sidewalls of the trenches. Further, the bottom of the trench is etched down until the top surface of magnetic memory elements 43 and 66 to form concave portions 64 and 65 which connect magnetic memory element 43 to bit line 60 and magnetic memory elements 66 to bit line 62, respectively. The bottom surface of the trench is deposited with a layer 67 such as Ta, TaN, or TiN, etc. which electrically connects between magnetic memory elements 43 and 66 and bit lines 59 and 62, respectively. A conductive material such as Cu is plated and filled in concave portions 63 and 64 and the trenches which form bit lines 59 and 62. The top surface of bit lines 59 and 62 and dielectric layer 59 are then polished and a permalloy layer 68 is deposited and patterned thereon. Bit line 59, for example, is enclosed by permalloy layers 63 and 68 which facilitate a magnetic field generated by a bit current in bit line 59 to focus on magnetic memory elements 43. The reading and writing operations are carried out by the same steps as mentioned earlier.

Figure 12:
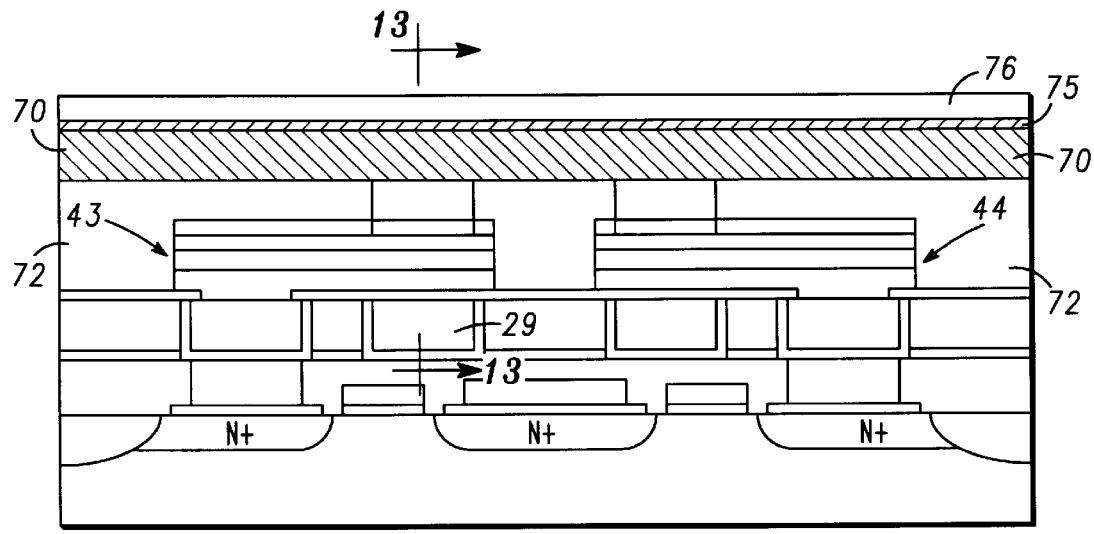
Figure 13:
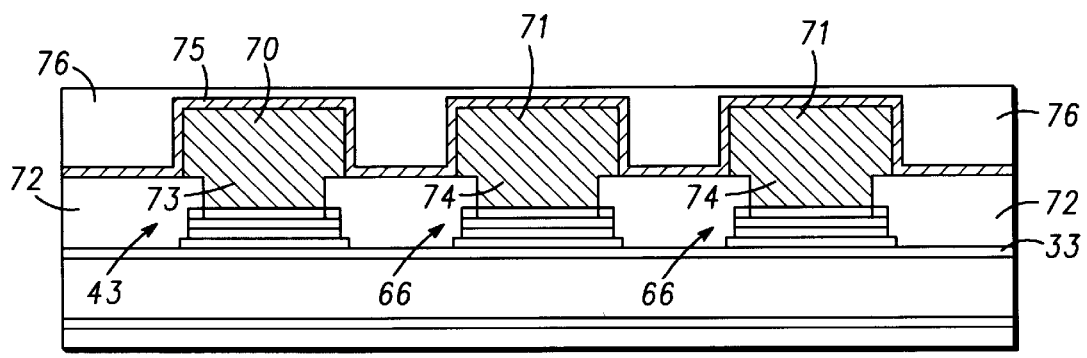

FIGS. 12 and 13 further illustrate another embodiment for forming bit lines 70 and 71. FIG. 13 is a partial cross-sectional view through digit line 29, magnetic memory element 43, and a bit line 70 indicated by arrows 13—13 in FIG. 12. After magnetic memory elements 43 and 44 are formed as shown in FIG. 7, a dielectric layer 72 is deposited overlying elements 43 and 44, and patterned and etched down to a top surface of elements 43 and 44 for making trenches 73 and 74. Next, metal material such as Al and Cu is filled in trenches 73 and 74 to form bit lines 70 and 71. The dielectric layer overlying bit line 73 and 74 is removed and a field focusing layer 75 such as NiFe is deposited on bit line 73 and 74 and dielectric layer 72. Then a dielectric layer 76 is deposited on field focusing layer 75.

Thus, an MRAM device with an improved and novel configuration and its fabrication method are disclosed in which circuitry for controlling magnetic memory element is fabricated first under the CMOS process and then the magnetic memory elements are fabricated and defined by forming inactive and active portions. Accordingly, magnetic memory elements are fabricated utilizing oxidation and/or nitridation of portions of the magnetic blanket layers and are thus prevented from degradation of metal composition caused by high temperatures. Further, because digit and bit lines are enclosed by a permalloy layer, magnetic fields generated by digit and bit currents are shielded and focused on magnetic memory elements, and less current is required. As disclosed, this technique can be applied to other devices using patterned magnetic elements, such as magnetic sensors, magnetic recording heads, magnetic recording media, or the like. Accordingly, such instances are intended to be covered by this disclosure.

What is claimed is:

1. A method of fabricating at least one magnetic element, the method comprising the steps of:
    depositing a magnetic element blanket layer;
    depositing a masking layer overlying the magnetic element blanket layer;
    removing portions of the masking layer overlying the magnetic element blanket layer to expose portions of the magnetic element blanket layer; and
    transforming the exposed portions of the magnetic element blanket layer, to form insulative inactive portions and active portions, the active portions defining the at least one magnetic element and the inactive portions defining dielectric insulators.

2. The method of fabricating the at least one magnetic element as claimed in claim 1 wherein the step of transforming the exposed portions of the magnetic element blanket layer, to form insulative inactive portions and active portions includes at least one of oxidizing or nitridizing the exposed portions.

3. The method of fabricating the magnetic device as claimed in claim 1 wherein the step of transforming the exposed portions of the magnetic element blanket layer, to form insulative inactive portions and active portions includes a combination of oxidizing and nitridizing the exposed portions.

4. A method of fabricating a magnetic device having a magnetic element and circuitry for controlling operations of the magnetic element, the method comprising the steps of:
    providing a substrate on which the magnetic element and the circuitry are formed;
    forming the circuitry on the substrate;
    depositing a dielectric layer on the circuitry;
    depositing a plurality of magnetic element blanket layers over the dielectric layer;
    depositing a masking layer overlying the plurality of magnetic element blanket layers;
    removing portions of the masking layer overlying the plurality of magnetic element blanket layers to expose portions of an uppermost layer of the plurality of magnetic element blanket layers; and
    transforming the exposed portions of the uppermost layer of the plurality of magnetic element blanket layers, to form insulative inactive portions and active portions, the active portions defining the magnetic element being coupled to the circuitry and the inactive portions defining dielectric insulators.

5. The method of fabricating the magnetic device as claimed in claim 4 wherein the step of depositing the plurality of magnetic element blanket layers includes the steps of:
    depositing a first magnetic layer;
    depositing a non-magnetic layer on the first magnetic layer; and
    depositing a second magnetic layer on the non-magnetic layer.

6. The method of fabricating the magnetic device as claimed in claim 5 wherein the step of depositing a non-magnetic layer includes a step of forming a non-magnetic layer between the first magnetic layer and the second magnetic layer.

7. The method of fabricating the magnetic device as claimed in claim 5 wherein the step of transforming the exposed portions of uppermost layer of the plurality of magnetic element blanket layers, to form insulative inactive portions and active portions includes at least one of oxidizing or nitridizing the exposed portions.

8. The method of fabricating the magnetic device as claimed in claim 7 wherein the step of oxidizing the exposed portions of uppermost layer of the plurality of magnetic element blanket layers includes plasma oxidation.

9. The method of fabricating the magnetic device as claimed in claim 8 wherein the step of oxidizing the exposed portions of uppermost layer of the plurality of magnetic element blanket layers includes oxidizing at a temperature of greater than 100° C.

10. The method of fabricating the magnetic device as claimed in claim 7 wherein the step of oxidizing the exposed portions of uppermost layer of the plurality of magnetic element blanket layers includes annealing in an atmosphere containing oxygen.

11. The method of fabricating the magnetic device as claimed in claim 7 wherein the step of nitridizing the exposed portions of uppermost layer of the plurality of magnetic element blanket layers includes plasma nitridation.

12. The method of fabricating the magnetic device as claimed in claim 11 wherein the step of nitridizing the exposed portions of uppermost layer of the plurality of magnetic element blanket layers includes plasma nitridation at a temperature of greater than 100° C.

13. The method of fabricating the magnetic device as claimed in claim 4 wherein the step of transforming the exposed portions of uppermost layer of the plurality of magnetic element blanket layers, to form insulative inactive portions and active portions includes a combination of oxidizing and nitridizing the exposed portions.

14. A method of fabricating a random access memory having a magnetic memory cell and circuitry for controlling operations of the magnetic memory cell, the method comprising the steps of:

provyiding a substrate on which the magnetic memory cell and the circuitry are formed;

forming the circuitry on the substrate including a first electrically conductive line;

depositing a dielectric layer on the circuitry;

depositing a plurality of magnetic memory blanket layers over the dielectric layer;

depositing an electrically conductive layer overlying the magnetic memory blanket layers;

removing portions of the electrically conductive layer thereby defining a plurality of contact pads and exposing portions of an uppermost layer of the plurality of magnetic memory blanket layers;

transforming a plurality of portions of the plurality of magnetic memory blanket layers utilizing at least one of oxidation and nitridation techniques to form dielectric insulator portions; and forming a second electrically conductive line that is perpendicular to the first electrically conductive line and is electrically coupled to the magnetic memory cell through the electrically conductive layer on the magnetic memory cell.

15. The method of fabricating the random access memory as claimed in claim 14 wherein the step of transforming a plurality of portions of the plurality of magnetic memory blanket layers includes plasma oxidation.

16. The method of fabricating the random access memory as claimed in claim 14 wherein the step of oxidizing the exposed portions of uppermost layer of the plurality of magnetic memory blanket layers includes plasma nitridation.

17. The method of fabricating the random access memory as claimed in claim 14 wherein the step of oxidizing the exposed portions of uppermost layer of the plurality of magnetic memory blanket layers includes annealing in an atmosphere containing oxygen.

18. The method of fabricating the random access memory as claimed in claim 14 wherein the step of depositing the plurality of magnetic memory blanket layers includes steps of:

depositing a first magnetic layer;

depositing a non-magnetic layer on the first magnetic layer; and depositing a second magnetic layer on the non-magnetic layer.

* * * * *

UNITED STATES PATENT AND TRADEMARK OFFICE
CERTIFICATE OF CORRECTION

PATENT NO.    : 6,165,803
DATED         : December 26, 2000
INVENTOR(S)   : Chen et al.

It is certified that error appears in the above-identified patent and that said Letters Patent is hereby corrected as shown below:

<u>Column 1,</u>
Line 3, after the Title, please add as a new first paragraph the following paragraph:

-- This invention was made with Government support under Agreement No. MDA972-96-3-0016 awarded by DARPA. The Government has certain rights in the invention. --

Signed and Sealed this

Nineteenth Day of August, 2003

JAMES E. ROGAN
*Director of the United States Patent and Trademark Office*